(12) United States Patent
Motz et al.

(10) Patent No.: US 12,341,482 B2
(45) Date of Patent: Jun. 24, 2025

(54) CHOPPER AMPLIFIER CIRCUITS AND METHOD FOR OPERATING CHOPPER AMPLIFIER CIRCUITS

(71) Applicant: Infineon Technologies AG, Neubiberg (DE)

(72) Inventors: Mario Motz, Wernberg (AT); Yongjia Li, Nan Jing (CN); Andrei-George Roman, Bucaresti (RO); Dragos Vocurek, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 723 days.

(21) Appl. No.: 17/644,471

(22) Filed: Dec. 15, 2021

(65) Prior Publication Data

US 2022/0190797 A1   Jun. 16, 2022

(30) Foreign Application Priority Data

Dec. 16, 2020   (DE) .................. 102020133668.3

(51) Int. Cl.
  *H03F 3/45*   (2006.01)
  *G01R 33/07*   (2006.01)
  *H03F 3/387*   (2006.01)

(52) U.S. Cl.
  CPC ............. *H03F 3/387* (2013.01); *G01R 33/07* (2013.01); *H03F 2200/459* (2013.01)

(58) Field of Classification Search
  CPC ...... H03F 3/387; H03F 2200/459; H03F 1/26; H03F 2200/261; H03F 2200/271; H03F 3/45475; H03F 3/38; H03F 3/45928; G01R 33/07; G01R 33/0029; G01R 33/075

USPC ....................... 330/9, 10, 252–254
See application file for complete search history.

(56) References Cited

U.S. PATENT DOCUMENTS

| 7,764,118 B2 * | 7/2010 | Kusuda ............... H03F 3/45977 327/124 |
| 10,148,237 B2 | 12/2018 | Raman et al. |
| 10,976,384 B2 * | 4/2021 | Okatake ................ G01R 33/07 |
| 2014/0145714 A1 | 5/2014 | Okatake et al. |

(Continued)

FOREIGN PATENT DOCUMENTS

| CN | 102109360 A | 6/2011 |
| CN | 106982035 A | 7/2017 |

(Continued)

*Primary Examiner* — Andrea Lindgren Baltzell
*Assistant Examiner* — Khiem D Nguyen
(74) *Attorney, Agent, or Firm* — Harrity & Harrity, LLP

(57) ABSTRACT

A chopper amplifier circuit includes a modulator circuit tuned to a chopper frequency, the modulator circuit being configured, in accordance with the chopper frequency, to convert a voltage into an AC voltage; an amplifier circuit having an inverting input and a non-inverting input for the AC voltage, and having an inverting output and a non-inverting output for providing an amplified AC voltage; and a demodulator circuit tuned to the chopper frequency, the demodulator circuit being configured to convert the amplified AC voltage into an amplified DC voltage. The demodulator circuit is configured to, during different switching phases, couple each of the inverting and non-inverting outputs of the amplifier circuit, both directly and capacitively, to each inverting and non-inverting input of a summing circuit.

17 Claims, 9 Drawing Sheets

(56) References Cited

U.S. PATENT DOCUMENTS

2017/0317622 A1 11/2017 Cai et al.
2018/0287567 A1 10/2018 Sugiura et al.
2020/0091880 A1 3/2020 Fan et al.

FOREIGN PATENT DOCUMENTS

CN 107332521 A 11/2017
JP 2014-216705 A 11/2014

\* cited by examiner

CHOPPER AMPLIFIER CIRCUITS AND METHOD FOR OPERATING CHOPPER AMPLIFIER CIRCUITS

CROSS REFERENCE TO RELATED APPLICATION

This application claims priority to German Patent Application No. 102020133668.3, filed on Dec. 16, 2020, the contents of which are incorporated by reference herein in their entirety.

TECHNICAL FIELD

The present disclosure relates to circuits and methods for chopper amplifiers in general, and particularly to circuits and methods for the reduction of chopper ripple.

BACKGROUND

Chopper amplifiers, also described hereinafter as chopper amplifier circuits, are a type of amplifier in which a signal to be amplified is modulated (chopped), amplified, and demodulated thereafter.

SUMMARY

According to a first aspect of the present disclosure, a chopper amplifier circuit is proposed. A chopper amplifier can also be described as a chopping amplifier. The chopper amplifier circuit comprises a modulator circuit tuned to a chopper frequency, which is configured, in accordance with the chopper frequency, to convert a DC measuring voltage (DC=direct current) into an AC measuring voltage (AC=alternating current), e.g., an alternating voltage. The chopper amplifier circuit further comprises an amplifier circuit having an inverting input and a non-inverting input for the AC measuring voltage, and having an inverting output and a non-inverting output for an amplified AC measuring voltage. The chopper amplifier circuit also comprises a demodulator circuit tuned to the chopper frequency, which is configured to convert the amplified AC measuring voltage into an amplified DC measuring voltage. The demodulator circuit is configured, during different switching phases (of the modulator or demodulator circuit), to couple each of the inverting and non-inverting outputs of the amplifier circuit, both directly and capacitively, to each inverting and non-inverting input of a summing circuit.

The DC measuring voltage and the amplified DC measuring voltage respectively can be direct voltages. However, in relation to the chopper frequency, the use of only slowly varying signals is also conceivable, such that the measuring voltage or the amplified DC measuring voltage, during a switching phase, can virtually be considered as direct voltages.

The amplifier circuit can comprise, for example, a simple one-loop amplifier, an operational amplifier, an instrumentation amplifier, a comparator or an ADC input.

Using the layout of the demodulator circuit proposed herein, a chopper ripple at the output of the chopper amplifier circuit can be reduced, in comparison with a conventional chopper amplifier circuit. The term "chopper ripple" describes offset voltages which are amplified by the amplifier circuit and demodulated by the demodulator circuit. A demodulation of a direct offset voltage may then result in an unwanted alternating voltage (chopper ripple). The proposed implementation and mode of operation of the demodulator circuit can reduce chopper ripple.

According to some example implementations, the demodulator circuit is configured, during a first switching phase of the (de)modulator circuit, to couple the non-inverting output of the amplifier circuit both directly to a first non-inverting input of the (averaging) summing circuit and capacitively to a second non-inverting input of the summing circuit, and to couple the inverting output of the amplifier circuit both directly to a first inverting input of the summing circuit and capacitively to a second inverting input of the summing circuit. The demodulator circuit is moreover configured, during a second switching phase of the (de)modulator circuit, to couple the non-inverting output of the amplifier circuit both directly to the second inverting input of the summing circuit and capacitively to the first inverting input of the summing circuit, and to couple the non-inverting output of the amplifier circuit both directly to the second inverting input of the summing circuit and capacitively to the first inverting input of the summing circuit. Using this alternating direct and capacitive coupling of the amplifier outputs to the inputs of the summing circuit for the constitution of average values, it is possible for the chopper ripple to be smoothed.

According to some example implementations, the demodulator circuit is configured, during a first switching phase, to directly couple the non-inverting output of the amplifier circuit, via a first signal path, to a first non-inverting input of the summing circuit, and to directly couple the inverting output of the amplifier circuit, via a second signal path, to a first inverting input of the summing circuit. The demodulator circuit is moreover configured, during a second switching phase of the (de)modulator circuit, to directly couple the non-inverting output of the amplifier circuit, via a third signal path, to a second inverting input of the summing circuit, and to directly couple the inverting output of the amplifier circuit, via a fourth signal path, to a second non-inverting input of the summing circuit. The first and fourth signal paths are mutually coupled via a first capacitance. The fourth signal path is coupled to ground via a second capacitance. The second and third signal paths are mutually coupled via a third capacitance. The third signal path is coupled to ground via a fourth capacitance. The first and second differential inputs of the summing circuit can thus be successively matched to one another. As a result, an average value can be constituted by the summing circuit with reduced ripple.

According to some example implementations, the first capacitance is greater than the second capacitance. Likewise, the third capacitance can be greater than the fourth capacitance. The first and second differential inputs of the summing circuit can thus be successively matched to one another during sequential switching phases.

According to some example implementations, the first and third capacitances respectively are equally rated. Likewise, the second and fourth capacitances respectively can be equally rated.

According to some example implementations, the first capacitance is 10 to 20 times greater than the second capacitance. Likewise, the third capacitance can be 10 to 20 times greater than the fourth capacitance. A particularly advantageous matching of the differential inputs of the summing circuit can be achieved accordingly.

According to some example implementations, the demodulator circuit is configured, during a first switching phase, to couple the non-inverting output of the amplifier circuit, via a first and second signal path, directly to a first non-inverting input of the summing circuit and, via a third and fourth signal path, capacitively to a second non-inverting input of the summing circuit, and to couple the inverting output of the amplifier circuit, via a fifth and sixth signal path, directly to a first inverting input of the summing circuit and, via a seventh and eighth signal path, capacitively to a second inverting input of the summing circuit. The demodulator circuit is moreover configured, during a second switching phase of the (de)modulator circuit, to couple the non-inverting output of the amplifier circuit, via a ninth and tenth signal path, directly to the second inverting input of the summing circuit and, via an eleventh and twelfth signal path, capacitively to the first inverting input of the summing circuit, and to couple the inverting output of the amplifier circuit, via a thirteenth and fourteenth signal path, directly to the second non-inverting input of the summing circuit and, via a fifteenth and sixteenth signal path, capacitively to the first non-inverting input of the summing circuit. Using this form of implementation, chopper ripple can be reduced still further.

According to some example implementations, the demodulator circuit is configured, during a first switching phase, to directly couple the non-inverting output of the amplifier circuit, via a first and second signal path, to a first non-inverting input of the summing circuit, and to directly couple the inverting output of the amplifier circuit, via a third and fourth signal path, to a first inverting input of the summing circuit. The demodulator circuit is moreover configured, during a second switching phase of the (de)modulator circuit, to directly couple the non-inverting output of the amplifier circuit, via a fifth and sixth signal path, to a second inverting input of the summing circuit, and to directly couple the inverting output of the amplifier circuit, via a seventh and eighth signal path, to a second non-inverting input of the summing circuit. The first and eighth signal paths are mutually coupled via a first capacitance. The eighth signal path is coupled to ground via a second capacitance. The second and seventh signal paths are mutually coupled via a third capacitance. The second signal path is coupled to ground via a fourth capacitance. The third and fifth signal paths are mutually coupled via a fifth capacitance. The fifth signal path is coupled to ground via a sixth capacitance. The fourth and sixth signal paths are mutually coupled via a seventh capacitance. The fourth signal path is coupled to ground via an eighth capacitance. Accordingly, the first and second differential inputs of the summing circuit can be even more effectively matched to one another during sequential switching phases.

According to some example implementations, a first output of the modulator circuit is directly connected to the inverting input of the amplifier circuit, and a second output of the modulator circuit is directly connected to the non-inverting input of the amplifier circuit. According to some example implementations, additionally or alternatively, a non-inverting input of the modulator circuit is directly connected to a signal source, and an inverting input of the modulator circuit is directly connected to the signal source. An input signal can thus be directly connected to the modulator circuit. The amplifier input can also be directly connected to the output of the modulator circuit. Using the proposed demodulator circuit, (high) input capacitances can be omitted.

According to some example implementations, the chopper amplifier circuit further comprises a Hall effect sensor, which is configured for spinning current operation, for the delivery of the measuring voltage. Sensors based upon the Hall effect, which are also described as Hall sensors, are frequently employed as magnetic field sensors. A Hall sensor comprises one or more Hall effect sensor elements, which measure a magnetic field strength and/or direction. These measurements are employed for the establishment of parameters such as, for example, distance, position and speed of rotation. However, Hall effect sensor elements are susceptible to offsets at their outputs, associated with mechanical loading, doping and geometrical errors. Hall effect sensor elements are, moreover, susceptible to an offset drift, which results in an unpredictable and temporally variable output error. Offsets of this type in Hall effect sensor elements can be reduced using the three-phase AC or spinning current method, in which the bias current of a Hall effect sensor element is spatially rotated about the Hall effect sensor element, while the output signals are averaged over time. This can reduce any offset or offset drift. The chopper amplifier circuit receives and amplifies the output signals of the Hall effect sensor elements. Example implementations of the present disclosure can further reduce residual offsets at the output of the chopper amplifier circuit.

According to a further aspect of the present disclosure, a method for operating a chopper amplifier circuit is also proposed. The method comprises, during different switching phases, the coupling of an inverting and of a non-inverting output of an amplifier of the chopper amplifier circuit, both directly and capacitively, to each inverting and non-inverting input of a summing circuit.

According to some example implementations, during a first switching phase, the non-inverting output of the amplifier circuit is coupled both directly to a first non-inverting input of the summing circuit, and capacitively to a second non-inverting input of the summing circuit. During the first switching phase, the inverting output of the amplifier circuit is also coupled both directly to a first inverting input of the summing circuit, and capacitively to a second inverting input of the summing circuit. During a second switching phase, the non-inverting output of the amplifier circuit is coupled both directly to the second inverting input of the summing circuit, and capacitively to the first inverting input of the summing circuit. During the second switching phase, the non-inverting output of the amplifier circuit is coupled both directly to the second inverting input of the summing circuit, and capacitively to the first inverting input of the summing circuit.

According to some example implementations, during the first switching phase, the non-inverting output of the amplifier circuit is directly coupled, via a first signal path, to a first non-inverting input of the summing circuit. During the first switching phase, the inverting output of the amplifier circuit is also directly coupled, via a second signal path, to a first inverting input of the summing circuit. During the second switching phase, the non-inverting output of the amplifier circuit is directly coupled, via a third signal path, to a second inverting input of the summing circuit. During the second switching phase, the inverting output of the amplifier circuit is also directly coupled, via a fourth signal path, to a second non-inverting input of the summing circuit. The first and fourth signal paths are thus mutually coupled via a first capacitance, the fourth signal path is coupled to ground via a second capacitance, the second and third signal paths are mutually coupled via a third capacitance, and the third signal path is coupled to ground via a fourth capacitance.

According to some example implementations, the first capacitance is greater than the second capacitance, and the third capacitance is greater than the fourth capacitance.

According to some example implementations, the first and third capacitances respectively are equally rated, and the second and fourth capacitances respectively are equally rated.

According to some example implementations, the first capacitance is 10 to 20 times greater than the second capacitance, and the third capacitance is 10 to 20 times greater than the fourth capacitance.

By the employment of an input modulator, an amplifier, (grounded) output capacitors which are directly connected to the amplifier output for direct current suppression, and coupling capacitors (stacked capacitors), which are connected to the output capacitors, chopper ripple suppression can be achieved using a switched capacitor leakage effect of the stacked capacitors (capacitive dividers). An offset-compensated chopper amplifier with low chopper ripple noise, a reduced jitter effect, a low signal delay (latency) and a limited chip surface area can be provided accordingly.

According to a further aspect of the present disclosure, a chopper amplifier circuit is proposed, having a modulator circuit which is tuned to a chopper frequency and which is configured, according to the chopper frequency, to convert a measuring voltage into an AC measuring voltage. The chopper amplifier circuit further comprises an amplifier circuit having an inverting input and a non-inverting input for the AC measuring voltage, and having an inverting output and a non-inverting output for an amplified AC measuring voltage. A demodulator circuit tuned to the chopper frequency is configured to convert the amplified AC measuring voltage into an amplified measuring voltage. The inverting output of the amplifier circuit is coupled, via a first capacitance in a first signal path, to a first input of the demodulator circuit. The non-inverting output of the amplifier circuit is coupled, via a second capacitance in a second signal path, to a second input of the demodulator circuit. A discharge resistor circuit is further provided, which is coupled on the output side of both capacitances between the first and second signal paths. Example implementations according to this basic circuit arrangement can also reduce chopper ripple, using the discharge resistor circuit. Using coupling via the discharge resistor circuit, a differential DC voltage between the non-inverting and inverting signal paths, and thus also chopper ripple, can be reduced.

According to some example implementations, a resistance value of the discharge resistor circuit lies in a region such that a time constant of the first or second capacitance, together with the discharge resistor circuit, lies within a range of $10/f_{chop}$ to $200/f_{chop}$, wherein $f_{chop}$ describes the chopper frequency. Resistances in the discharge resistor circuit can thus be configured with a high-resistance rating, in order to achieve a lengthy discharge period.

According to some example implementations, the discharge resistor circuit comprises a first discharge resistor assembly, which is coupled between an output terminal of the first capacitance and a reference potential, and a second discharge resistor assembly, which is coupled between an output terminal of the second capacitance and the reference potential. The reference potential can be, for example, a common-mode potential.

According to some example implementations, the discharge resistor circuit comprises a switch assembly which is configured, during a discharge period, to switch the first discharge resistor assembly between the first capacitance and the reference potential, and to switch the second discharge resistor assembly between the second capacitance and the reference potential. Discharging of capacitances can thus be deliberately executed during discharge periods.

According to some example implementations, the discharge period corresponds to a period between a first and second switching phase of the modulator circuit.

According to some example implementations, the switch assembly executes switched-mode operation, such that discharge periods lie between a first and second switching phase of the modulator circuit. A cycle rate of the discharge resistor circuit can thus be synchronized with the chopper frequency, or can also be generated in a pseudo-random manner. As a result, intermodulation effects associated with an input signal can be reduced still further.

According to some example implementations, a duty factor of the switch assembly lies within a range of 0.1%-5%.

According to some example implementations, the discharge resistor circuit can comprise one or more switched capacitors. Using switched capacitors, resistances in accordance with $R=1/f_sC$ can be achieved, where $f_s$ signifies the switching frequency of a switched capacitor. In comparison with the resistances of integrated circuits, capacitances can be manufactured with greater precision, and high resistance values can be achieved with small capacitances.

According to some example implementations, the discharge resistor circuit can comprise one or more voltage-controlled pseudo-resistors, incorporating series-connected MOS transistors. Pseudo-resistors can employ diode-based MOS components, which operate in the sub-threshold range and, in comparison with a separate counterpart, occupy a smaller area.

According to some example implementations, a first output of the modulator circuit is directly connected to the inverting input of the amplifier circuit, and a second output of the modulator circuit is directly connected to the non-inverting input of the amplifier circuit. According to some example implementations, additionally or alternatively, a non-inverting input of the modulator circuit is directly connected to a signal source, and an inverting input of the modulator circuit is directly connected to the signal source. An input signal can thus be directly connected to the modulator circuit. The amplifier input can also be directly connected to the output of the modulator circuit. Using the proposed demodulator circuit, (large) input capacitances can be omitted.

According to some example implementations, the chopper amplifier circuit further comprises a low-pass or band-stop filter circuit, coupled to the demodulator circuit on the output side, having a filter order equal to or lower than three. It is thus possible to accurately filter out any residual ripples at the chopper frequency $f_{chop}$. Filters of this type are also described as twin-T filters, on grounds of the R-C-R arrangement on one path, and the C-R-C arrangement on the parallel path, in the shape of a T. It is thus possible to filter out a specific frequency in a highly selective manner, in this case preferably $f_{chop}$. Using the proposed advantageous design of the demodulator circuit, even low-pass filter circuits of a low order are sufficient to adequately suppress any residual chopper ripple pulse (voltage spikes).

According to some example implementations, the chopper amplifier circuit further comprises a Hall effect sensor, which is configured for spinning-current operation, for the delivery of the measuring voltage.

According to a further aspect of the present disclosure, a method is proposed for operating a chopper amplifier circuit, wherein an inverting output of an amplifier, via a first capacitance, is coupled to a first input of a demodulator circuit, and a non-inverting output of the amplifier, via a second capacitance, is coupled to a second input of the demodulator circuit. A discharge resistor circuit is coupled to the output terminals of the first and second capacitance.

According to some example implementations, an input terminal of the first capacitance is coupled to the inverting output of the amplifier, and an output terminal of the first capacitance is coupled to the first input of the demodulator circuit. An input terminal of the second capacitance is coupled to the non-inverting output of the amplifier, and an output terminal of the second capacitance is coupled to the second input of the demodulator circuit.

According to some example implementations, an output terminal of the first capacitance is coupled to a first terminal of a first discharge resistor assembly, a second terminal of the first discharge resistor assembly is coupled to a pre-defined reference potential, an output terminal of the second capacitance is coupled to a first terminal of a second discharge resistor assembly, and a second terminal of the second discharge resistor assembly is coupled to the pre-defined reference potential.

According to some example implementations, the first and second discharge resistor assemblies are respectively coupled to the predefined reference potential, using a duty-cycle switch, for a discharge period.

According to some example implementations, the discharge period corresponds to a period between a first and a second switching phase of the demodulator circuit.

By the employment of an input modulator, an amplifier, (AC-coupled) output capacitors which are connected directly between the amplifier output and the demodulator, and a duty-cycled resistor or switched-cap resistor, or pseudo-resistor, with MOS transistors connected in the non-conducting direction, for the delivery of a bias voltage, chopper ripple suppression can be achieved. An offset-compensated chopper amplifier with low chopper ripple noise, a reduced jitter effect, a low signal delay (latency) and a limited chip surface area can be provided accordingly.

BRIEF DESCRIPTION OF THE DRAWINGS

A number of examples of apparatuses and/or methods are described in greater detail hereinafter, for example purposes only, with reference to the attached figures. In the figures.

DETAILED DESCRIPTION

Figure 1:
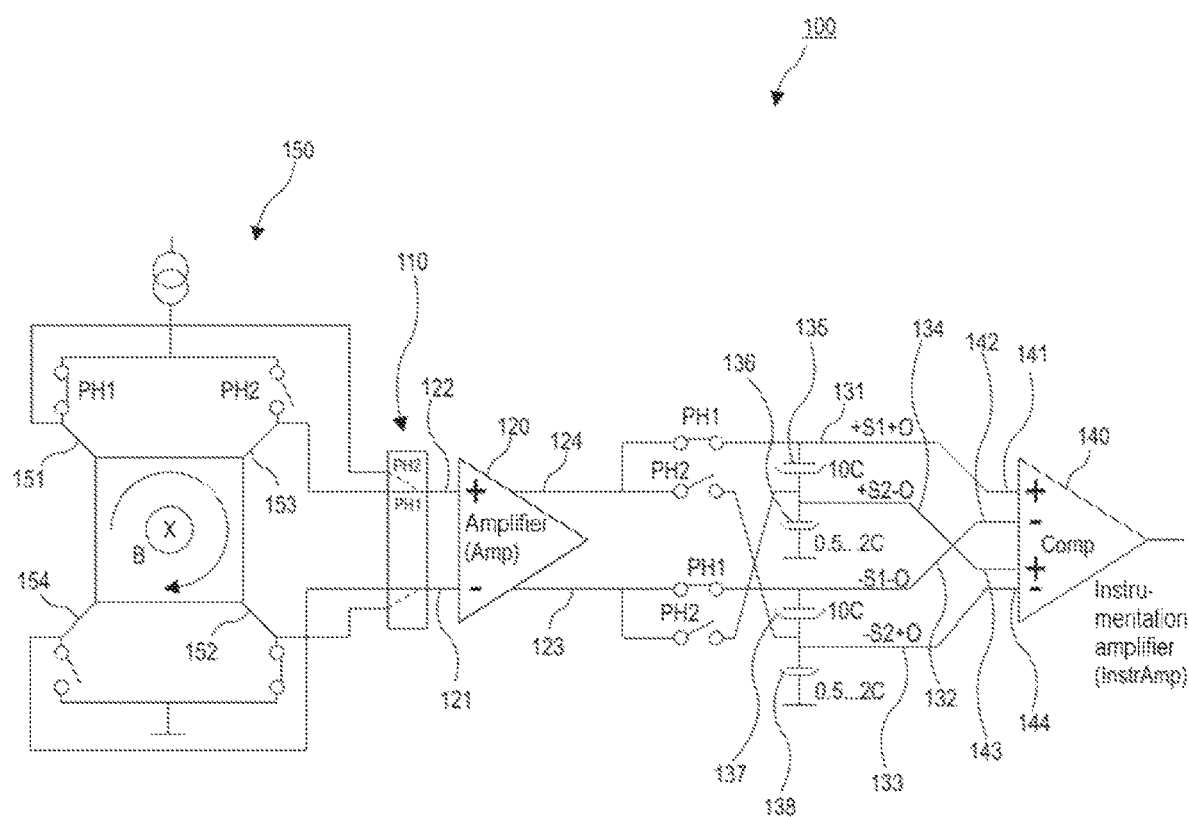
FIG. 1 shows the basic layout of a chopper amplifier according to one example implementation of the present disclosure, having a stacked capacitor demodulator and inherent chopper ripple suppression, in combination with a rotating Hall effect sensor.

A number of examples will now be described in greater detail, with reference to the attached figures. However, further potential examples are not limited to the features of those implementations which are described in detail. These can incorporate modifications to features, or corresponding elements and alternatives to the features. Moreover, the terminology employed herein for the description of specific examples does not constitute any limitation with respect to further potential examples.

In the entire description of the figures, identical or similar reference symbols identify identical or similar elements or features which, in each case, can be implemented in an identical or modified form, whilst delivering an identical or similar function. In the figures, moreover, the thickness of lines, planes and/or regions may be exaggerated, in the interests of clarification.

If two elements A and B are combined by the inclusion of "or", it is to be understood that all potential combinations are disclosed accordingly, e.g. only A, only B, or A and B, unless expressly defined otherwise in individual cases. As alternative wordings for the same combinations, "at least one of A and B" or "A and/or B" can be employed. The same applies, in an equivalent manner, to combinations of more than two elements.

If a singular form, e.g. "a, an" or "the", is employed, and the employment of only a single element is not defined as mandatory, either explicitly or implicitly, further examples can also employ a plurality of elements, in order to implement the same function. If a function is described hereinafter as being implemented by the employment of a plurality of elements, further examples can implement the same function by the employment of a single element or a single processing entity. It is further understood that the employment of the terms "comprises", "comprising", "incorporates" and/or "incorporating", by the use thereof, describes the presence of the features, whole numbers, steps, operations, processes, elements or components indicated, and/or a combination thereof, but does not exclude the presence or addition of one or more further features, whole numbers, steps, operations, processes, elements or components, and/or a combination thereof.

Chopper amplifiers, also described hereinafter as chopper amplifier circuits, are a type of amplifier in which a signal to be amplified is modulated (chopped), amplified, and demodulated thereafter. By the employment of a technology of this type, a zero error (or offset error) and any "1/f noise" of an amplifier can be displaced to a frequency band which is of no relevance. Chopper amplifiers of this type can be employed, for example, in bandgap circuits for the delivery of a specific reference voltage, but can also be employed in other applications in which a signal is to be amplified, for example for the amplification of measuring signals.

However, this modulation and demodulation, also described as chopping, are responsible for the generation of ripples in the output signal. Ripples of this type can be caused, for example, by a voltage offset of an amplifier which is employed in the chopper amplifier for the purposes of amplification. The ripple amplitude corresponds to the offset and the ripple frequency corresponds to the chopper frequency.

Various techniques have been employed for the reduction of ripples of this type. In some cases, at least, techniques of this type are relatively expensive to implement, are disadvantageous with respect to current consumption, or are limited to a specific chopper frequency.

Some implementations described herein enable improved techniques for the reduction of chopper ripple.

FIG. 1 shows a chopper amplifier circuit 100 according to a first example implementation of the present disclosure.

The chopper amplifier circuit 100 comprises a modulator circuit 110 which is tuned to a chopper frequency $f_{chop}$. The modulator circuit 110 is configured to convert a DC input voltage, which originates from a signal source 150, into an AC input voltage. The DC input voltage during a switching phase (chopper phase) PH1 or PH2 of the modulator circuit 110, by way of approximation, can be assumed to be approximately constant. However, the DC input voltage can also vary over time, albeit at a frequency which is substantially lower than the chopper frequency $f_{chop}$. In the example implementation represented, the signal source 150 is configured in the form of a Hall effect sensor, which be operated in a "spinning current" mode. During a first switching phase PH1, a first current flows via the terminals 151, 152, such that a first Hall voltage can be tapped-off at the terminals 153, 154. During a subsequent second switching phase PH1, a second current flows via the terminals 153, 154, such that a second Hall voltage can be tapped-off at the terminals 151, 152, etc. It is understood that example implementations of the present disclosure can also be operated with other signal sources, which are suitable for combination with chopper amplifiers.

On the output side of the modulator circuit 110, the chopper amplifier circuit 100 further comprises an amplifier 120, which incorporates an inverting input 121 and a non-inverting input 122 for the AC input voltage (for example, the Hall voltage). The inputs 121,122 can also be described as a negative and a positive input, and constitute a differential input. The amplifier 120 also comprises an inverting output 123 and a non-inverting output 124 for an amplified AC measuring voltage. Correspondingly, the outputs 123, 124 can be described as a negative and a positive output, and constitute a differential output. The amplifier 120 can be, for example, an operational amplifier. However, other implementations of amplifiers are also conceivable.

An inverting output of the modulator circuit 110 is directly or immediately connected (e.g. without any interposition of capacitances) to the inverting input 121 of the amplifier 120, and a non-inverting output of the modulator circuit 110 is directly connected to the non-inverting input 122 of the amplifier 120. A non-inverting input of the modulator circuit 100 is directly connected to the signal source 150 (terminals 151, 153) and an inverting input of the modulator circuit 110 is directly connected to the signal source 150 (terminals 152, 154).

On the output side of the amplifier 120, the chopper amplifier circuit 100 comprises a demodulator circuit 130 which is tuned to the chopper frequency $f_{chop}$. The demodulator circuit 130 is configured to convert the AC voltage which is amplified by the amplifier 120 back into an amplified DC voltage. According to example implementations of the present disclosure, the demodulator circuit 130 is configured, during different switching phases PH1, PH2, to couple each of the inverting and non-inverting outputs 123, 124 of the amplifier 120, both directly (immediately) and capacitively with each inverting and non-inverting input of an averaging summing circuit 140. The summing circuit 140 can be considered as an element of the demodulator circuit 130.

In the example implementation shown in FIG. 1, the summing circuit 140 is represented as a summing amplifier having two differential inputs. The summing circuit 140 comprises a first non-inverting input 141, a first inverting input 142, a second non-inverting input 143 and a second inverting input 144. The inputs 141, 142 constitute a first differential input of the summing circuit, and the inputs 143, 144 constitute a second differential input of the summing circuit 140. The differential inputs are employed for the constitution of averages. In some aspects, the summing circuit 140 can also be implemented in a different form, for example using comparators, amplifiers or ADC inputs.

The modulator circuit 110 and the demodulator circuit 130 each comprise a plurality of switches, which are opened or closed in different switching phases PH1, PH2. The switches of the modulator circuit 110 and the demodulator circuit 130 operate with a synchronous duty cycle. The demodulator circuit 130, in the example implementation shown in FIG. 1, is configured, during a first switching phase PH1, to couple the non-inverting output 124 of the amplifier 120 both directly to the first non-inverting input 141 of the summing circuit 140 and capacitively (via a capacitance 135) to the second non-inverting input 143 of the summing circuit 140. The demodulator circuit 130 according to FIG. 1 is further configured, during the first switching phase PH1, to couple the inverting output 123 of the amplifier 120 both directly (immediately) to the first inverting input 142 of the summing circuit 140 and capacitively (via a capacitance 137) to the second inverting input 144 of the summing circuit 140. The differential output 123, 124 of the amplifier 120, in the first switching phase PH1, is thus directly or immediately coupled to the first differential input 141, 142 of the summing circuit 140, and capacitively coupled to the second differential input 143, 144 of the summing circuit 140.

The demodulator circuit 130 is further configured, during the second switching phase PH2, to couple the non-inverting output 124 of the amplifier 120 both directly to the second inverting input 144 of the summing circuit 140 and capacitively (via a capacitance 137) to the first inverting input 142 of the summing circuit 140. The demodulator circuit 130 is further configured, during the second switching phase PH2, to couple the inverting output 123 of the amplifier circuit 120 both directly to the second non-inverting input 143 of the summing circuit 140 and capacitively (via a capacitance 135) to the first non-inverting input 141 of the summing circuit 140. The differential output of the amplifier 120, in the second switching phase PH2, is thus directly or immediately coupled to the second differential input 143, 144 of the summing circuit 140, and capacitively coupled to the first differential input 141, 142 of the summing circuit 140.

In the example implementation shown in FIG. 1, the demodulator circuit 130, during the first switching phase PH1, couples the non-inverting output 124 of the amplifier 120, via a first signal path 131, directly to the first non-inverting input 141 of the summing circuit 140. Moreover, the demodulator circuit 130, during the first switching phase PH1, couples the inverting output 123 of the amplifier 120, via a second signal path 132, directly to the first inverting input 142 of the summing circuit 140. The demodulator circuit 130, during the second switching phase PH2, couples the non-inverting output 124 of the amplifier 120, via a third signal path 133, directly to the second inverting input 144 of the summing circuit 140. The demodulator circuit 130, during the second switching phase PH2, couples the inverting output 123 of the amplifier 120, via a fourth signal path 134, directly to the second non-inverting input 143 of the summing circuit 140. The first signal path 131 and the fourth signal path 134 are mutually coupled via a coupling capacitance 135. The fourth signal path 134 is coupled to ground via an output capacitance 136. The second signal path 132 and the third signal path 133 are mutually coupled via a coupling capacitance 137. The third signal path 133 is coupled to ground via an output capacitance 138.

The coupling capacitance 135 is configured with a higher rating than the output capacitance 136. Correspondingly, the coupling capacitance 137 is configured with a higher rating than the output capacitance 138. In order to obtain equal signal ratios at the two differential inputs 141, 142 and 143, 144 of the summing circuit 140, the two coupling capacitances 135, 137 can each be equally dimensioned. Likewise, the two output capacitances 136, 138 can be equally dimensioned. As indicated in FIG. 1, the coupling capacitances 135, 137 can be 10 to 20 times greater than the output capacitances 136, 138.

Figure 2:
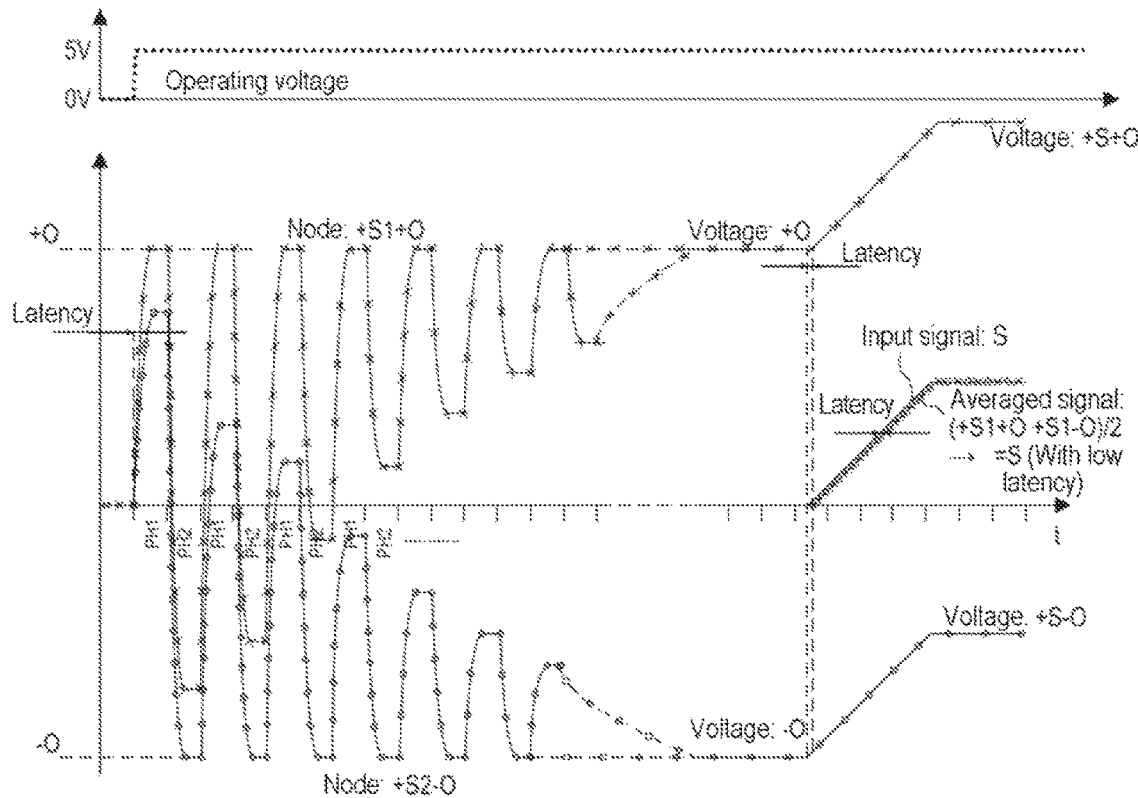
FIG. 2 shows a transient response of the chopper amplifier according to FIG. 1.
Figure 2:
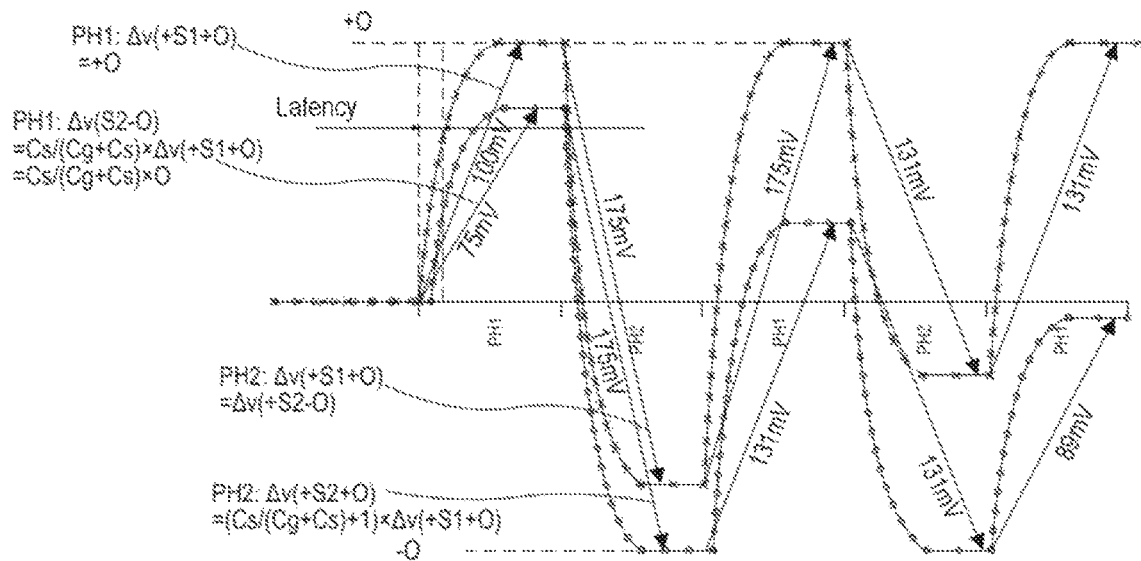

The operating method of the chopper amplifier circuit 100 will now be described with reference to FIG. 2.

All the capacitance nodes +S1+O, +S2−O, −S1−O, −S2+O, further to switch-in, assume an operating voltage of 0V. In this case, an input signal from the signal source 150 also commences at 0V and, in this example, only rises after multiple chopper cycles, before going on (after a number of further chopper cycles) to assume a constant value (other than 0V). In chopper phase PH1, node +S1+O, using direct coupling, is charged to an amplified offset voltage of the amplifier 120 (plus the offset voltage of the Hall effect sensor). A signal voltage, in the first phase PH1, is not yet present. An upper plate of the coupling capacitance 135 and the input of the averaging summing circuit 140 are directly galvanically coupled to the positive amplifier output 124. Node +S2−O, in PH1, is separated from the amplifier output 124 but, as a result of the capacitive voltage divider ratio of 0V, is charged to a partial voltage of +S1+O. The fraction of this voltage on node +S2−O is thus calculated as $C_{st}/(C_{st}+C_{gnd})$ and, for example, comprises only 75% of the voltage of +S1+O, where the capacitance ratio $C_{st}/C_{gnd}=3$. In this case, $C_{st}$ represents a capacitance value of a coupling capacitance, and $C_{gnd}$ represents a capacitance value of an output capacitance.

In chopper phase PH2, node +S2−O is charged to the negative value of the amplified offset of the amplifier 120 (plus the synchronous negative offset of the Hall sensor plate), as this node is directly galvanically connected to the negative output 123 of the amplifier 120. At the same time, however, in the input modulator 110 (chopper modulator), the input signal is inversely connected to the differential amplifier input 121, 122. The differential input 121, 122 of the amplifier 120 thus detects an offset in the form of a DC value, whereas the input signal is received in the form of an AC signal at the chopper frequency of the modulator 110 (and of the synchronous chopper demodulator 130). Given that, upon the transition from phase PH1 to phase PH2, node +S2−O is recharged from +75% of the offset to −100% of the offset, an alternating signal of equal magnitude is applied at node +S1+O, as the top plate of the coupling capacitance 135 is only loaded with a stray capacitance of negligible magnitude (e.g. no significant capacitive voltage divider reduces this dynamic capacitive voltage coupling).

Node +S1+O in the circuit, using direct coupling, is always charged to the positive offset in phase PH1, whereas node S2−O, using direct coupling, is always charged to the negative offset in phase PH2. However, as a result of the capacitive voltage divider in phase PH1, only a proportion of the voltage variation is assumed on node S1+O in all cases. In phase PH2, however, the full voltage variation is communicated from node S2−O to node S1+O. Ultimately, however, as the AC voltage on node S1+O decays, the positive offset voltage is adjusted, and the negative offset voltage on node S2−O is adjusted, if no further input signal is present. However, the average value of both voltages is also 0V, and an averaging (or summing) sequential circuit 140 thus also detects an input signal of 0V only, with no superimposed offset or offset ripple (ripple at the chopper frequency) in a "steady state".

In the event of a variation in an input signal, the amplifier 120 (but also the nodes which are directly or dynamically coupled via capacitances) is capable of following the input signal. The time delay is thus only dependent upon the amplifier bandwidth, but not upon the chopper frequency or the chopper phase vis-à-vis the input signal. Accordingly, this system can operate in continuous time, and features no sampling effects of the type associated with sample & hold circuits or switched-capacitor circuits. Although, in the circuit 100, capacitances can also be switched-in and switched-out, any signal variation, even midway through the chopper phase, is received in full on the output, with no effective occurrence of any aliasing effects. Moreover, as a result of continuous time operation, there is no kT/C noise from switched capacitances, e.g. of the type associated with switched-capacitor circuits.

In the enlarged temporal representation of signal characteristics, a voltage divider factor of 75% in phase PH2 can be seen with respect to the preceding change of voltage. The AC voltage decays accordingly. Asymmetry of the capacitive voltage divider ratio in phase PH1 (75%) and in phase PH2 (100%), as yet, generates only minor ancillary effects, which can nevertheless be eliminated by example implementations according to FIG. 3.

Figure 3:
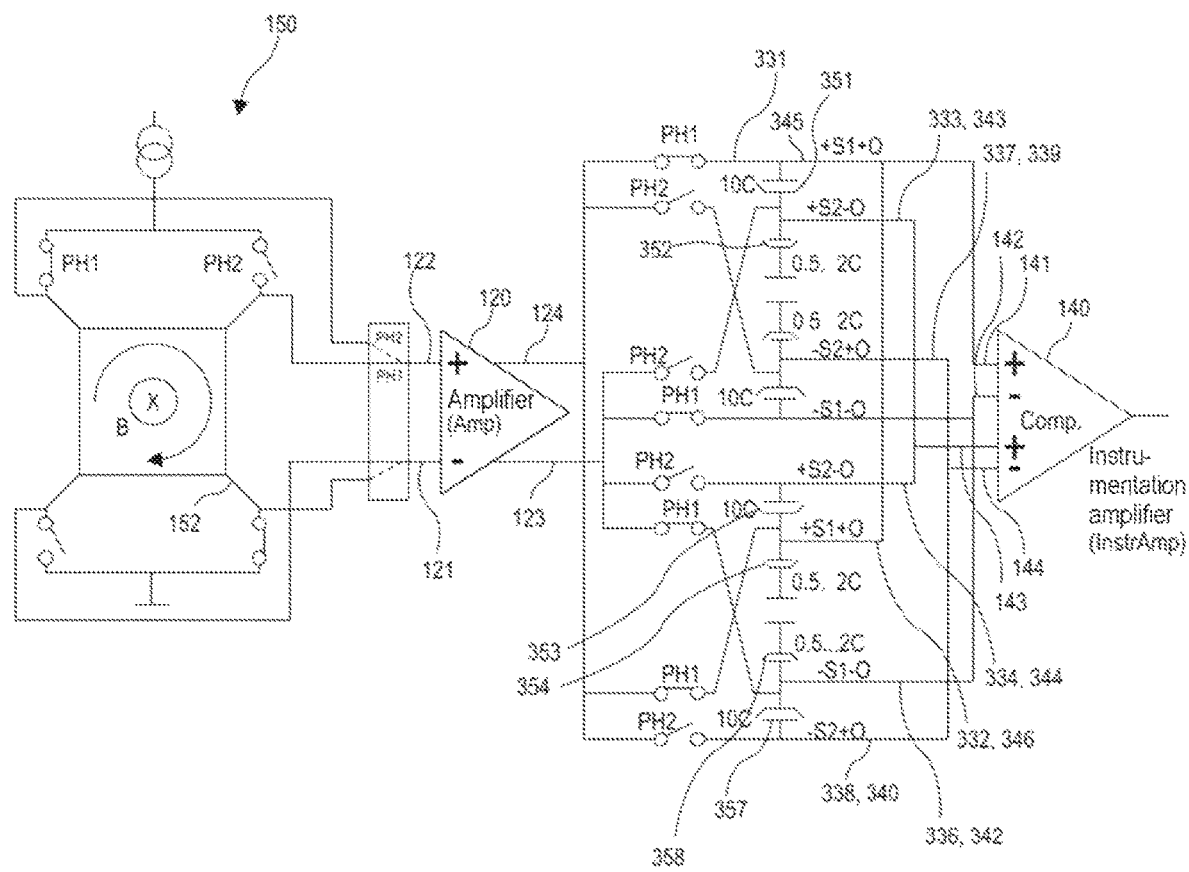
FIG. 3 shows a symmetrical layout of a chopper amplifier according to a further example implementation of the present disclosure, having a stacked capacitor demodulator and inherent chopper ripple suppression, in combination with a rotating Hall effect sensor.

FIG. 3 shows a chopper amplifier circuit 300 according to a further example implementation.

In some implementations, the chopper amplifier circuit 300 represented in FIG. 3 incorporates a demodulator circuit 330 having a symmetrical layout, in relation to FIG. 1.

The demodulator circuit 330 is configured, during the first switching phase PH1, to couple the non-inverting output 124 of the amplifier 120, via a first signal path 331 and a second signal path 332, directly to the first non-inverting input 141 of the summing circuit 140. Via a third signal path 333 (via capacitance 351) and a fourth signal path 334 (via capacitance 353), the non-inverting amplifier output 124, during the first switching phase PH1, is capacitively coupled to the second non-inverting input 143 of the summing circuit 140. The demodulator circuit 330 is further configured, during the first switching phase PH1, to couple the inverting amplifier output 123, via a fifth signal path 335 and a sixth signal path 336, directly to the first inverting input 142 of the summing circuit 140. The demodulator circuit 330 is moreover configured, during the first switching phase PH1, to couple the inverting amplifier output 123 via a seventh signal path 337 (via capacitance 355) and via an eighth signal path 338 (via capacitance 357) capacitively to the second inverting input 144 of the summing circuit 140. The differential output 123, 124 of the amplifier 120, in the first switching phase PH1, is thus directly or immediately coupled to the first differential input 141, 142 of the summing circuit 140, and is capacitively coupled to the second differential input 143, 144 of the summing circuit 140. However, the signal from each amplifier output to each summing circuit input is thus consistently routed via two different signal paths.

The demodulator circuit 330 is configured, during the second switching phase PH2, to couple the non-inverting amplifier output 124, via a ninth signal path 339 and via a tenth signal path 340, directly to the second inverting input 141 of the summing circuit 140, and to couple the non-inverting amplifier output 124, via an eleventh signal path 341 (via capacitance 355) and via a twelfth signal path 342 (via capacitance 357), capacitively to the first inverting input 142 of the summing circuit 140. In the second switching phase PH2, the inverting amplifier output 123, via a thirteenth signal path 343 and via a fourteenth signal path 344, is directly coupled to the second non-inverting input 143 of the summing circuit 140. Moreover, in the second switching phase PH2, the inverting amplifier output 123, via a fifteenth signal path 345 (via capacitance 351) and via a sixteenth signal path 346 (via capacitance 353), is capacitively coupled to the first non-inverting input 141 of the summing circuit 140. The differential output of the amplifier 120, in the second switching phase PH2, is thus directly or immediately coupled to the second differential input 143, 144 of the summing circuit 140, and is capacitively coupled to the first differential input 141, 142 of the summing circuit 140. However, the signal from each amplifier output to each summing circuit input is thus consistently routed via two different signal paths.

During the first switching phase PH1, the differential amplifier output 123, 124 is thus directly coupled to the first differential input 141, 142 of the summing circuit 140 and capacitively coupled to the second differential input 143, 144 of the summing circuit 140. However, in comparison with FIG. 1, each amplifier output 123, 124 is respectively led via two different signal paths to one input of the summing circuit 140. During the second switching phase PH2, the differential amplifier output 123, 124 is directly coupled to the second differential input 143, 144 of the summing circuit 140, and capacitively coupled to the first differential input 141, 142 of the summing circuit 140. However, in comparison with FIG. 1, each amplifier output 123, 124 is respectively led via two different signals paths to one input of the summing circuit 140.

The demodulator circuit 330 is thus configured, during the first switching phase PH1, to couple the non-inverting amplifier output 124, via the signal paths 331 and 332, directly to the first non-inverting input 141 of the summing circuit 140. The demodulator circuit 330 is configured, during the first switching phase PH1, to couple the inverting amplifier output 123, via the signal paths 335 and 336, directly to the first inverting input 142 of the summing circuit 140. The demodulator circuit 330 is configured, during the second switching phase PH2, to couple the non-inverting amplifier output 124, via the signal paths 337 and 338, directly to the second inverting input 144 of the summing circuit 140. The demodulator circuit 330 is further configured, during the second switching phase PH2, to couple the inverting amplifier output 123, via the signal paths 343 and 344, directly to the second non-inverting input 143 of the summing circuit. The signal path 331 and the signal path 343 are thus mutually coupled via a coupling capacitance 351. The signal path 343 is coupled to ground via an output capacitance 352. The signal path 332 and the signal path 344 are mutually coupled via a coupling capacitance 353. The signal path 332 is coupled to ground via an output capacitance 354. The signal paths 335 and 337 are mutually coupled via a coupling capacitance 355. The signal path 337 is coupled to ground via an output capacitance 356. The signal paths 338 and 336 are mutually coupled via a coupling capacitance 357. The signal path 336 is coupled to ground via an output capacitance 358.

Here again, the respective coupling capacitances can be equally dimensioned. Likewise, the respective output capacitances can be equally dimensioned. The coupling capacitances can be 10 to 20 times greater than the output capacitances.

In the example implementation according to FIG. 3 an equal capacitive voltage divider ratio is generated in each switching phase PH1, PH2, on the grounds that, in each phase, a direct connection exists, both to an upper plate (terminal) of a plurality of coupling capacitances $C_{st}$, and to an upper plate of the output capacitances $C_{gnd}$, and thus to the lower plate of the coupling capacitances $C_{st}$.

In each switching phase PH1, PH2, an equal number of output capacitors are connected to the differential amplifier output 123, 124, and an equal number of coupling capacitors are connected to the down-circuit summing circuit 140 (e.g. a comparator, ADC or output amplifier). The upper plates of the grounded output capacitors attune themselves to the differential signal and the negative offset of the amplifier 120 (and of the rotating Hall sensor plate). The upper plates of the (floating) coupling capacitors also attune themselves to the differential signal. However, these nodes carry the positive offset. In the (differential) summing circuit 140, the signal is averaged and the offset is cleared. The summing circuit 140 can constitute a comparator with a twin differential input, or an amplifier, or an ADC input. After a number of chopper cycles, the double offset voltage oscillates to a direct voltage which is cleared in the summing circuit 140 such that, after a number of cycles, the chopper offset ripple decays. Nevertheless, the rapid signal on the input of the summing circuit 140 is sustained, given that, in a first switching phase, the upper node point of the coupling capacitor is directly connected to the output of the amplifier 120 and is simultaneously connected to the input of the summing circuit 140 and, in the other switching phase, the amplifier 120 is capacitively and rapidly coupled from the lower node point of the coupling capacitor to the upper node point, and ultimately to the summing circuit 140. The settling time of the decaying chopper offset ripple is defined by the ratio of the grounded output capacitors to the coupling capacitors.

Figure 4A:
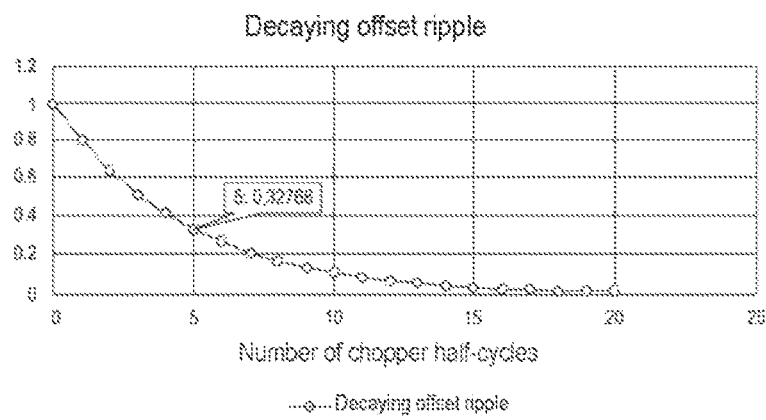
FIGS. 4A and 4B show an estimation and simulation of chopper ripple decay associated with the switch-in of a capacitive divider of stacked and grounded capacitors.
Figure 4B:
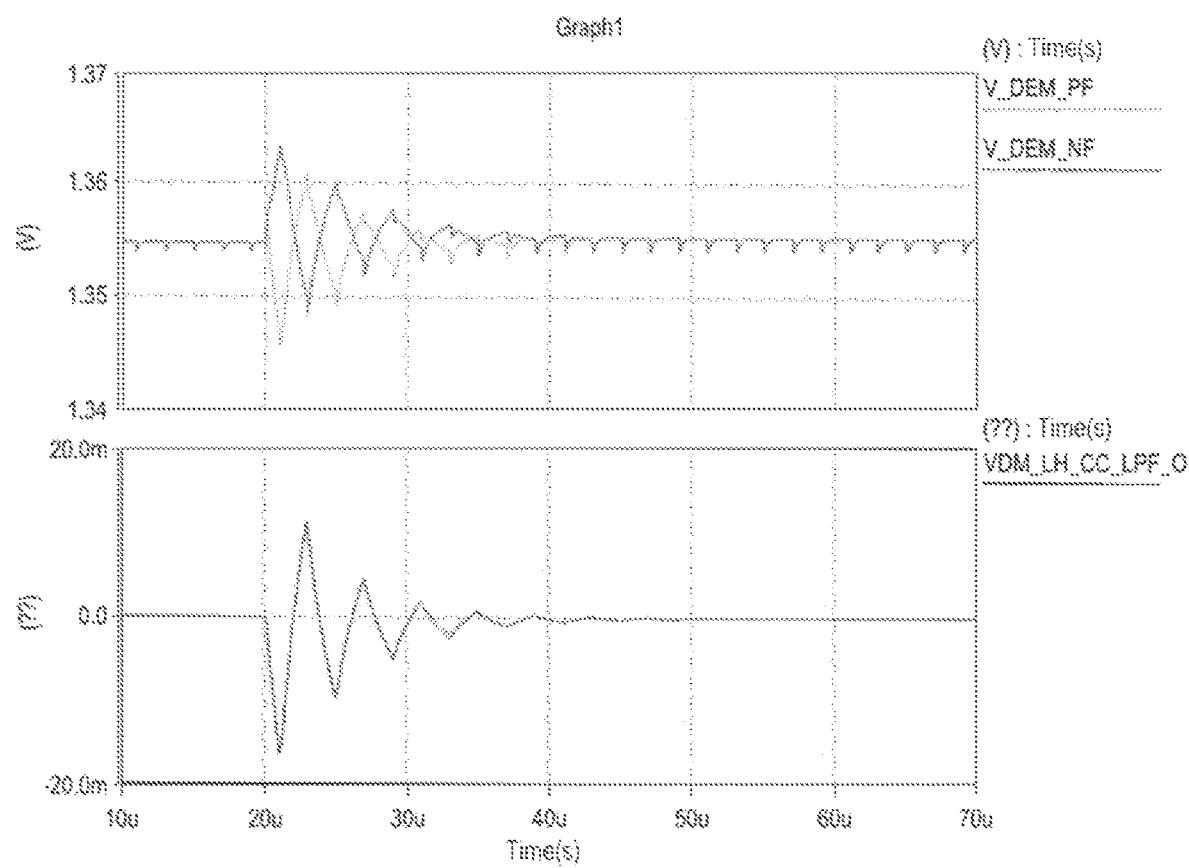

In the event of a ratio of the coupling capacitors ($C_{st}$) to the grounded output capacitors ($C_{gnd}$) of 1 pF/0.25 pF, the settling time of the offset ripple is given by the voltage divider effect of the switched capacitors: $C_{st}/(C_{gnd}+C_{st})$ for each chopper half-cycle; in a symmetrical arrangement of coupling capacitors: 1 pF/1.25 pF=0.8 of the original offset step after the first chopper half-cycle, 0.8^2=0.64 after two chopper half-cycles, and so on. This relationship is represented in FIG. 4A, B.

After 20 chopper half-cycles (=10 full chopper cycles), the offset ripple, according to a notional offset step response, decays to approximately 1%. In reality, the variation in offset in relation to the chopper frequency is very slow and, in normal operation, ripple suppression is virtually perfect.

Figure 5:
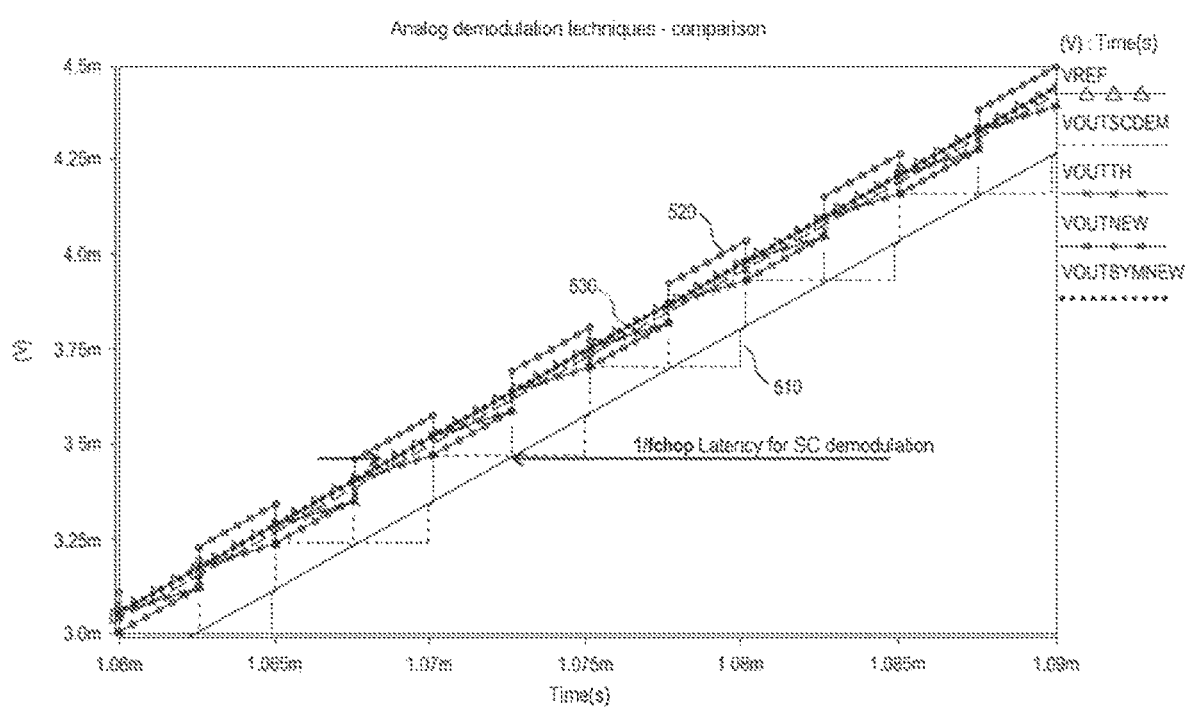
FIG. 5 shows a comparison of various analog demodulation technologies, with example implementations of the present disclosure.

FIG. 5 shows a performance comparison of example implementations of the present implementation with conventional chopper amplifier applications. The curve 510 shows a comparatively pronounced chopper offset ripple, where a conventional track & hold demodulator is employed. The curve 520 shows a chopper offset ripple which can be achieved using an example implementation according to FIG. 1. The chopper offset ripple is indirectly proportional to the ratio of the coupling capacitors to the grounded output capacitors. The curve 530 shows a chopper offset ripple which can be achieved using an example implementation according to FIG. 3. It can be seen that, by the employment of a symmetrical design, virtually no further chopper offset ripple is present.

By the employment of an input modulator 110, an amplifier 120, (grounded) output capacitors which are directly connected to the output of the amplifier 120 for DC suppression, and of coupling capacitors (stacked capacitors) which are connected to the output capacitors, using a switched capacitor leakage effect of the coupling capacitors (capacitive dividers), chopper ripple suppression can be achieved. An offset-compensated chopper amplifier with low chopper ripple noise, a reduced jitter effect, a low signal delay (latency) and a limited chip surface area can be provided accordingly.

Figure 6:
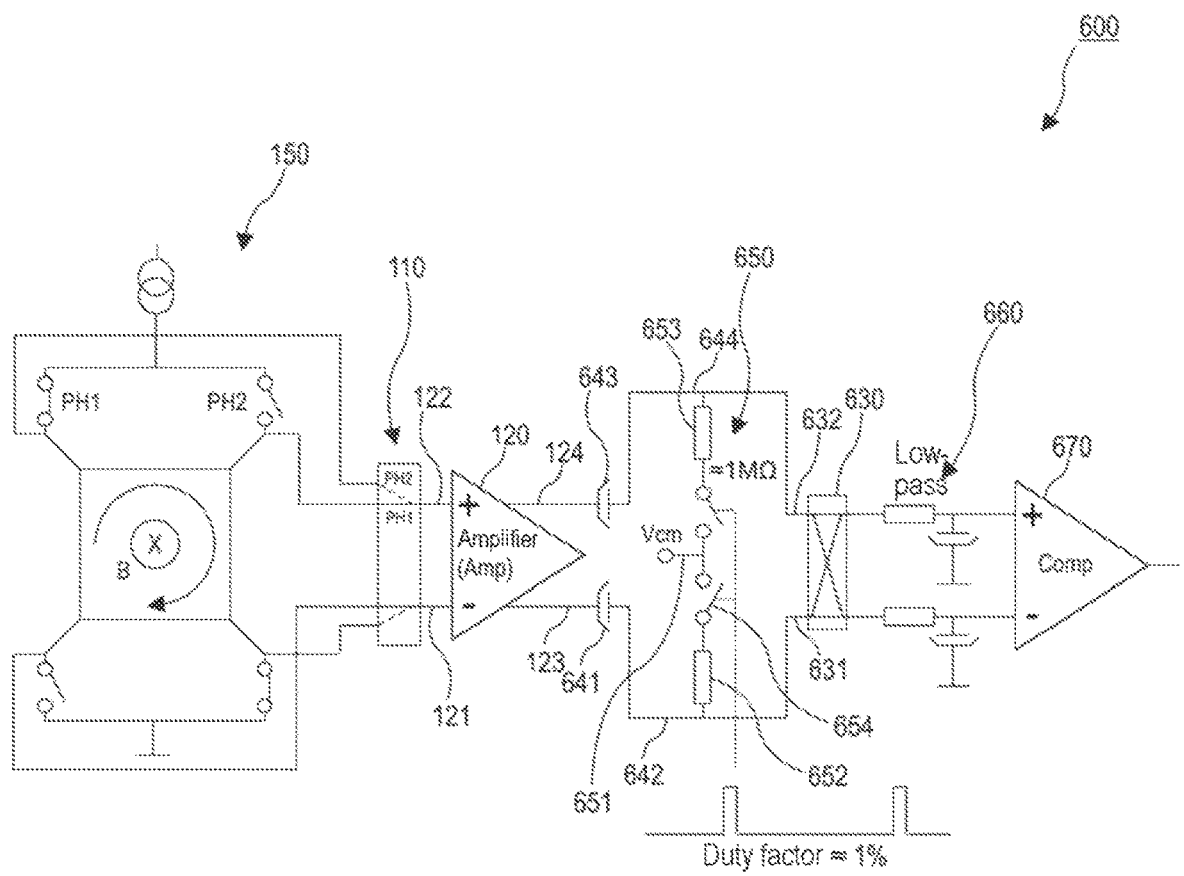
FIG. 6 shows the basic layout of a chopper amplifier according to a further example implementation of the present disclosure, having inherent chopper ripple suppression, in combination with a rotating Hall effect sensor.

FIG. 6 shows a further example implementation of a chopper amplifier circuit 600, according to an example implementation of the present disclosure.

The chopper amplifier circuit 600 again comprises a modulator circuit 110 tuned to the chopper frequency which is configured, according to the chopper frequency, to convert a DC input voltage from a signal source 150 into an AC input voltage. The chopper amplifier circuit further comprises an amplifier 120, which is arranged on the output side of the modulator circuit. The amplifier 120 comprises an inverting input 121 and a non-inverting input 122 for the AC input voltage which is received from the modulator 110. The inverting input and the non-inverting input 122 constitute a differential input.

Outputs of the modulator circuit 110 are directly or immediately connected (e.g. without the interposition of capacitances) to the inputs 121, 122 of the amplifier 120. Inputs of the modulator circuit 100 are directly connected to outputs of the signal source 150.

The amplifier 120 comprises an inverting output 123 and a non-inverting output 124. The inverting output 123 and the non-inverting output 124, in combination, constitute a differential output of the amplifier 120 for an amplified AC voltage. On the differential amplifier output 123, 124, a demodulator circuit 630 tuned to the chopper frequency is provided, which is configured to convert the amplified AC voltage into an amplified DC output voltage. The inverting amplifier output 123 is coupled via a first capacitance 641, in a first signal path 642, to a first input 631 of the demodulator circuit 630. The non-inverting amplifier output 124 is coupled via a second capacitance 643, in a second signal path 644, to a second input 632 of the demodulator circuit. On the output side of both capacitances 641, 643, a discharge resistor circuit 650 is coupled between the first signal path 642 and the second signal path 644.

The discharge resistor circuit 650, in the example implementation represented in FIG. 6, comprises a first discharge resistor 652, which coupled between an output terminal of the first capacitance 641 and a reference potential 651. The discharge resistor circuit 650 further comprises a second discharge resistor 653, which is coupled between an output terminal of the second capacitance 643 and the reference potential 651. The input terminal of the first capacitance 641 is coupled to the inverting amplifier output 123. The input terminal of the second capacitance 643 is coupled to the non-inverting amplifier output 124. The discharge resistor circuit 650 further comprises a switch assembly 654 which is configured, during at least one discharge period, to switch the first discharge resistor 652 between the first capacitance 641 and the reference potential 651, and to switch the second in sequence between the second capacitance 643 and the reference potential 651.

The reference potential 651 can be, for example, a common mode potential or ground.

Figure 7:
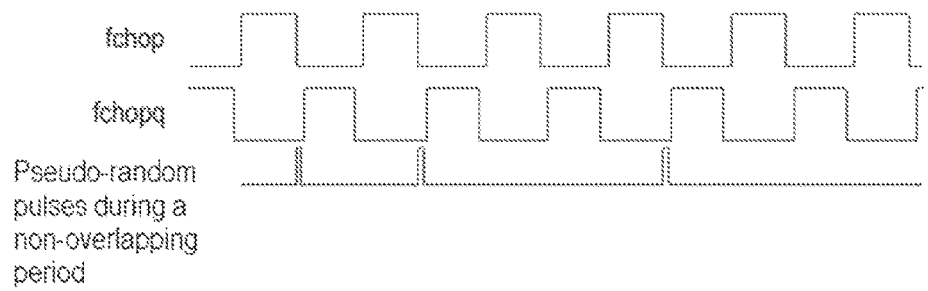
FIG. 7 shows a representation of pseudo-random pulses during non-overlapping chopper phases for the suppression of an offset direct voltage up-circuit of a chopper demodulator, after a number of chopper phases.

The discharge period preferably corresponds to a period between the first switching phase (chopper phase) PH1 and the second switching phase PH2 of the modulator circuit 110. The two switching phases PH1 and PH2 are non-overlapping. This is represented schematically in FIG. 7. The two discharge resistors 652, 653, after the completion of switching phase PH1 and prior to the commencement of switching phase PH2, are thus connected to the reference potential 651 using the switch assembly 654. During the switching phases PH1 and PH2, the discharge resistors 652, 653 are in no-load operation, e.g. are not connected to the reference potential 651. According to some example implementations, a duty factor of the switching assembly 654 can lie in the region of 0.1% to 5%. According to example implementations, the switches of the switching assembly 654, outside the switching phases PH1 and PH2 are closed in a period between the two switching phases PH1 and PH2. During the switching phases PH1 and PH2, the switches of the switching assembly 654 are open. The switching instants of the switching assembly 654 can, for example, coincide with the chopper frequency. In some example implementations, however, the duty factor of the switching assembly 650 can also be selected in a pseudo-random manner. The switching instants of the switching assembly 650 are thus, in any event, arranged in intermediate periods between two sequential switching phases PH1 and PH2, but not necessarily in each of these intermediate periods.

Using the capacitive coupling of the amplifier outputs 123, 124 to the inputs of the demodulator circuit 630 and the discharge resistor circuit 650, a DC voltage differential between the non-inverting and inverting signal paths 644, 642, and thus the chopper ripple, can be reduced. Accordingly, a low-pass filter circuit 660 with a low order number equal to or lower than three (in this case, of the $1^{st}$ order), coupled to the demodulator circuit 630 on the output side, will be sufficient.

It has proved to be advantageous if the discharge resistors 652, 653 are configured with a comparatively high resistance rating (for example, in the region of 1 MΩ), thereby resulting in lengthy discharge periods. The switched-mode operation of the discharge resistors 652, 653 associated with the switching assembly 654 is such that, effectively, the resistors are even greater, or assume a higher resistance rating.

Figure 8:
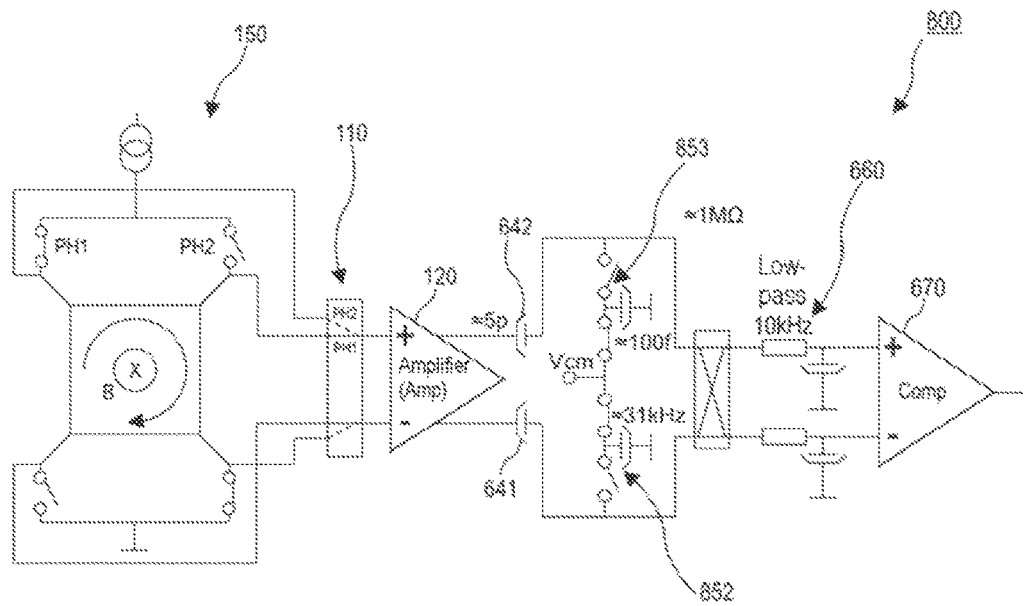
FIG. 8 shows an example implementation of an AC-coupled demodulation method, with switched capacitors as a discharge resistance.

Particularly in case of the implementation of discharge resistors 652, 653 in integrated circuits, it can be problematic to achieve very high resistance ratings. FIG. 8 therefore shows an example implementation of a chopper amplifier circuit 800, in which the discharge resistors 652, 653 are configured in the form of switched capacitors 852, 853. Switched-capacitor filters, also frequently described as "SC filters" for short, are electronic filters in which ohmic resistors are replaced by switched capacitors. These are discrete-time filters. By the variation of the switching frequency $f_s$ at which the capacitances 852, 853 are switched, the filter parameters of the SC filters can be varied in a highly straightforward manner. The replacement of resistors R in a given circuit, such as a low-pass filter circuit, by capacitances $C_S$ which are operated at the switching frequency $f_s$, can be calculated by $R=1/f_s C_S$. It will be evident to a person skilled in the art that the switching frequency, $f_s$ of the capacitances 852, 853 does not need to correspond to the chopper frequency $f_{chop}$.

During the non-overlapping intervals of the chopper demodulation phases, a short-term and limited charge equalization can be executed, such that the temporal average is only balanced to a differential value of 0V after multiple (numerous) chopper phases. Continuous-time signal processing, which is also executed in this case (signals can also vary during the chopper phases, and be fed through the output amplifier capacitively), differs, for example, from sampled switched-capacitor circuits, on the grounds that, in a single chopper phase, no complete and rapid charge equalization is executed. Conversely, charge equalization can only be achieved after multiple chopper phases, as a result of which the amplitude of the actual useful signal is substantially maintained (with negligible discharging of the useful signal within a chopper phase). The small partial discharge to an average differential value=0V can be achieved using a small switched capacitor circuit, which can be interpreted as a high-resistance discharge resistor, or which functions as such. This can also be achieved using a duty-cycled resistor during the short non-overlapping interval.

Figure 9:
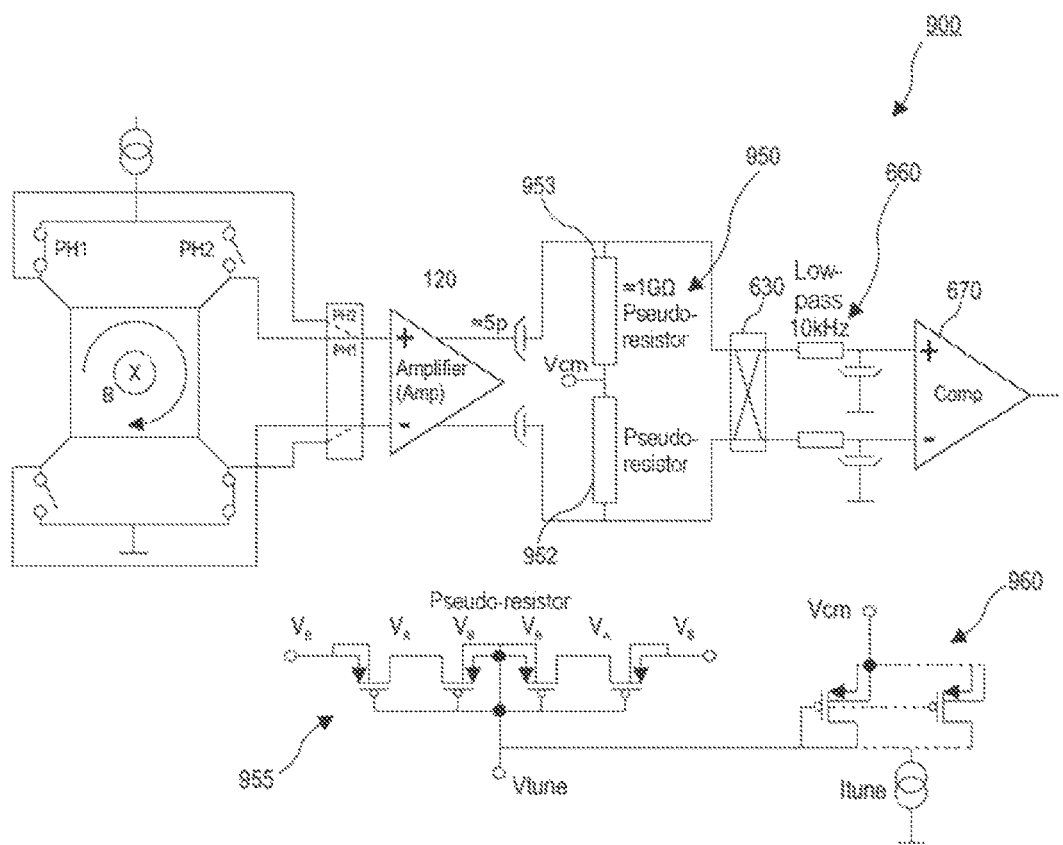
FIG. 9 shows an example implementation of an AC-coupled demodulation method, with a pseudo-resistor as a discharge resistance.

A further option for the execution of the discharge resistors 652, 653 is represented in FIG. 9. In this case, the discharge resistors are executed in the form of "pseudo-resistors" 952, 953.

According to some example implementations, the discharge resistor circuit 950 can incorporate one or more voltage-controlled pseudo resistors 952, 953 comprised of series-connected MOS transistors. Pseudo-resistors can employ diode-based MOS components, which operate in the sub-threshold range and, in comparison with a separate counterpart, occupy a smaller area. As represented in FIG. 9 (lower part), one or more MOSFETs 955, having a voltage bias in the sub-threshold range, can function in a circuit as a linear resistor, the resistance of which is controlled by the gate voltage. A voltage between the terminals A and B of MOS pseudo-resistors varies e.g. from −1V to +1V, and corresponding resistance variations for different gate voltages have been illustrated for different types of voltage-controlled pseudo-resistors. A potential structure of voltage-controlled PMOS pseudo-resistors is represented in FIG. 9 (lower part). In addition to PMOS or NMOS types, supplementary MOS pseudo-resistors are also conceivable.

Figure 10:
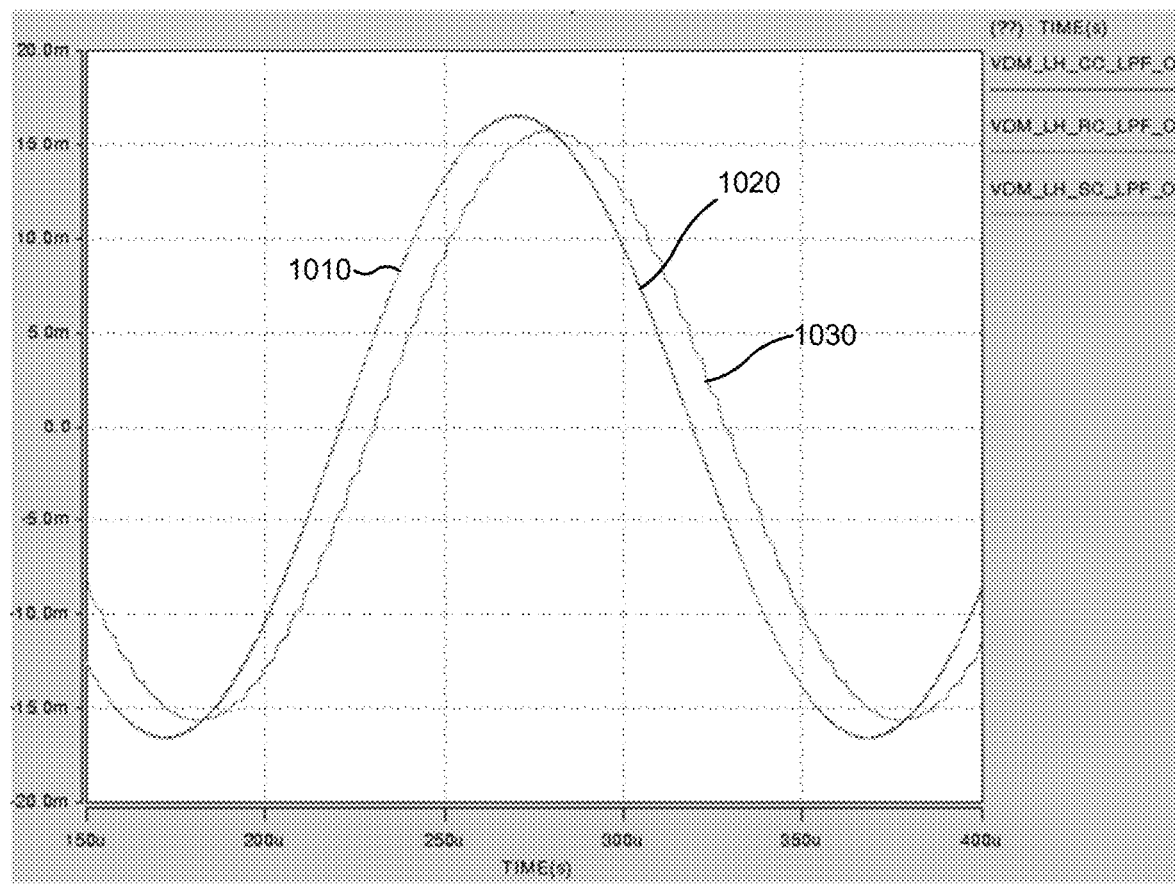
FIG. 10 shows simulated waveforms of demodulated output signals of three different chopper amplifier topologies.

FIG. 10 shows a simulated waveform of the demodulated output of different chopper amplifier topologies. It will be seen that the example implementations according to FIGS. 1 and 3 (reference number 1010) and the example implementations according to FIGS. 6, 8 and 9 (reference number 1020) feature a lower latency and a more time-continuous output waveform than conventional chopper amplifier topologies (reference number 1030).

Figure 11:
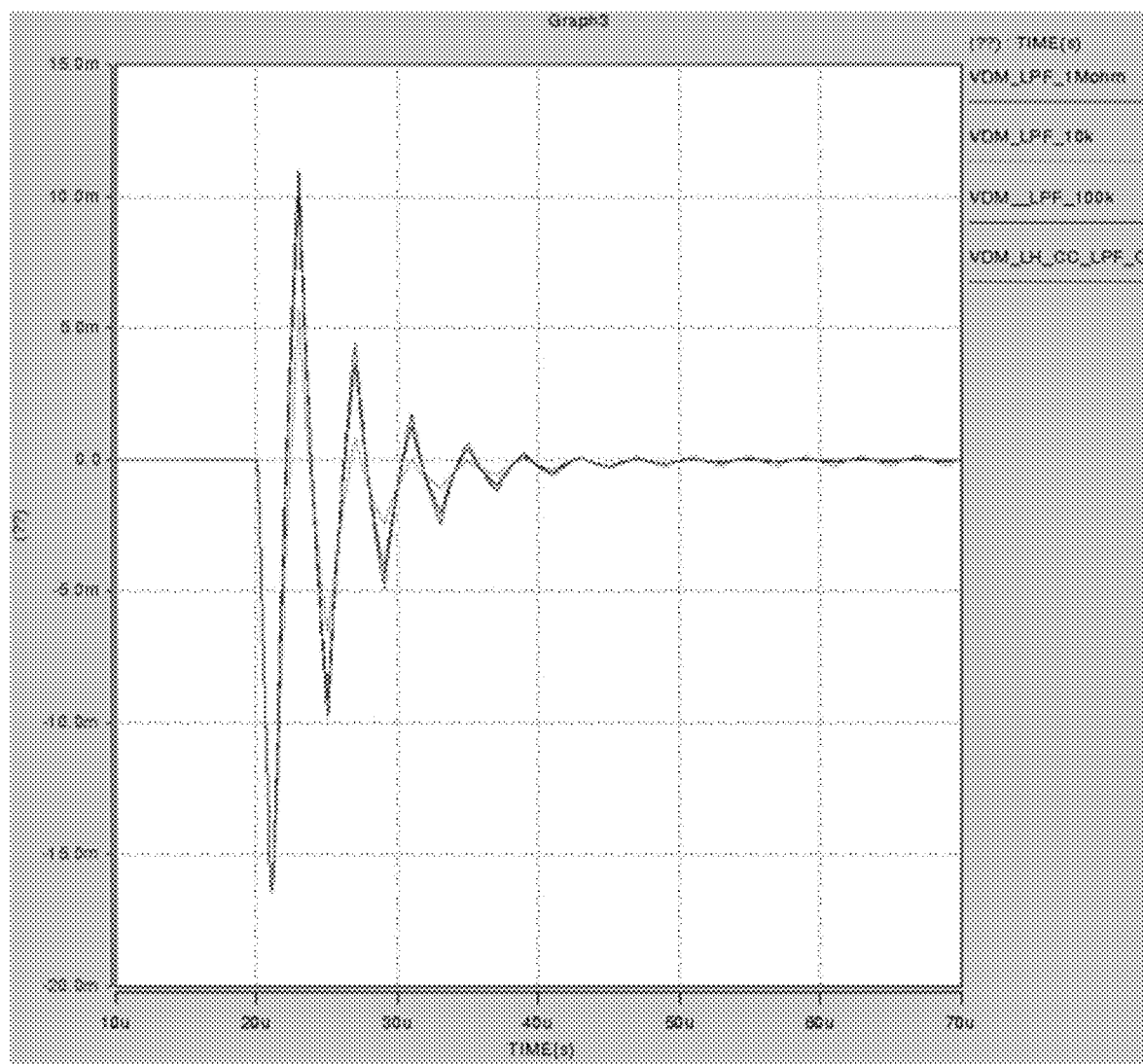
FIG. 11 shows the influence of differently switched resistances upon the response time and residual ripple of a proposed chopper amplifier.

From FIG. 11, it can be seen that larger switched discharge resistors are associated with a longer offset ripple adjustment time, but also with reduced residual chopper ripple.

In combination with the spinning Hall sensor concept, by the employment of an input modulator 110, an amplifier 120, (AC-coupled) output capacitors 641, 643 which are connected directly between the amplifier output and the demodulator, and a duty-cycled resistor or switched-cap resistor, or pseudo-resistor, with MOS transistors connected in the non-conducting direction, for the delivery of a bias voltage, chopper ripple suppression can thus be achieved. An offset-compensated chopper amplifier with low chopper ripple noise, a reduced jitter effect, a low signal delay (latency) and a limited chip surface area can be provided accordingly.

The aspects and features described in conjunction with one of the specific above-mentioned examples can also be combined with one or more of the further examples, such that an identical or similar feature of the further example is replaced, or the feature is additionally incorporated in the further example.

It is further understood that the disclosure of a plurality of steps, processes, operations or functions which are disclosed in the description or in the claims do not necessarily need to be executed in the sequence described, unless this is explicitly indicated in the individual case concerned, or is absolutely necessary for technical reasons. Accordingly, the preceding description does not limit the execution of a plurality of steps or functions to a specific sequence. Moreover, in further examples, an individual step, an individual function, an individual process or an individual operation can comprise a number of sub-steps, sub-functions, sub-processes or sub-operations and/or can be divided into the latter.

Where a number of aspects, in the preceding paragraphs, have been described in conjunction with an apparatus or a system, these aspects are also to be understood as a description of the corresponding method. Thus, for example, a unit, an apparatus or a functional aspect of the apparatus or system can correspond to a feature, for example a process step, of the corresponding method. Accordingly, aspects which are described in conjunction with a method are also to be understood as a description of a corresponding unit, a corresponding element, a property or a functional feature of a corresponding apparatus or a corresponding system.

The following claims are thus incorporated in the detailed description, wherein each claim can stand as a separate example per se. It should moreover be observed that—although a dependent claim, in the claims, refers to specific combination thereof with one or more further claims—further examples can also comprise a combination of the dependent claim with the subject matter of any other dependent or independent claim. Such combinations are hereby explicitly proposed, unless it is indicated, in a particular case, that a specific combination is not intended. It is moreover intended that features of a claim should be included in each other independent claim, even where this claim is not directly defined as dependent upon the other independent claim.

What is claimed is:

1. A chopper amplifier circuit, comprising:
    a modulator circuit tuned to a chopper frequency, the modulator circuit being configured, in accordance with the chopper frequency, to convert a voltage into an AC voltage;
    an amplifier circuit having an inverting input and a non-inverting input for the AC voltage, and having an inverting output and a non-inverting output for providing an amplified AC voltage; and
    a demodulator circuit tuned to the chopper frequency, the demodulator circuit being configured to convert the amplified AC voltage into an amplified DC voltage, wherein the demodulator circuit is configured to:

during different switching phases, couple each of the inverting output and the non-inverting output of the amplifier circuit, both directly and capacitively, to each inverting input and non-inverting input of a summing circuit, the summing circuit having a plurality of inverting inputs and a plurality of non-inverting inputs coupled to the demodulator circuit according to the different switching phases.

2. The chopper amplifier circuit as claimed in claim 1, wherein the demodulator circuit is configured to:
during a first switching phase:
couple the non-inverting output of the amplifier circuit both directly to a first non-inverting input of the summing circuit and capacitively to a second non-inverting input of the summing circuit, and
couple the inverting output of the amplifier circuit both directly to a first inverting input of the summing circuit and capacitively to a second inverting input of the summing circuit, and
during a second switching phase:
couple the non-inverting output of the amplifier circuit both directly to the second inverting input of the summing circuit and capacitively to the first inverting input of the summing circuit, and
couple the inverting output of the amplifier circuit both directly to the second non-inverting input of the summing circuit and capacitively to the first non-inverting input of the summing circuit.

3. The chopper amplifier circuit as claimed in claim 1, wherein the demodulator circuit is configured to:
during a first switching phase:
couple the non-inverting output of the amplifier circuit, via a first signal path, directly to a first non-inverting input of the summing circuit, and
couple the inverting output of the amplifier circuit, via a second signal path, directly to a first inverting input of a summing circuit, and during a second switching phase:
couple the non-inverting output of the amplifier circuit, via a third signal path, directly to a second inverting input of the summing circuit, and
couple the inverting output of the amplifier circuit, via a fourth signal path, directly to a second non-inverting input of the summing circuit,
wherein the first signal path and the fourth signal path are mutually coupled via a first capacitance,
wherein the fourth signal path is coupled to a ground via a second capacitance,
wherein the second signal path and the third signal path are mutually coupled via a third capacitance, and
wherein the third signal path is coupled to the ground via a fourth capacitance.

4. The chopper amplifier circuit as claimed in claim 3, wherein the first capacitance is greater than the second capacitance, and
wherein the third capacitance is greater than the fourth capacitance.

5. The chopper amplifier circuit as claimed in claim 3, wherein the first capacitance and the third capacitance are equally dimensioned, and
wherein the second capacitance and the fourth capacitance are equally dimensioned.

6. The chopper amplifier circuit as claimed in claim 3, wherein the first capacitance is 10 to 20 times greater than the second capacitance, and
wherein the third capacitance is 10 to 20 times greater than the fourth capacitance.

7. The chopper amplifier circuit as claimed in claim 1, wherein the demodulator circuit is configured to, during a first switching phase:
couple the non-inverting output of the amplifier circuit, via a first signal path and a second signal path, directly to a first non-inverting input of the summing circuit and, via a third signal path and a fourth signal path, capacitively to a second non-inverting input of the summing circuit, and
couple the inverting output of the amplifier circuit, via a fifth signal path and a sixth signal path, directly to a first inverting input of the summing circuit and, via a seventh signal path and an eighth signal path, capacitively to a second inverting input of the summing circuit, and
during a second switching phase:
couple the non-inverting output of the amplifier circuit, via a ninth signal path and a tenth signal path, directly to the second inverting input of the summing circuit and, via an eleventh signal path and a twelfth signal path, capacitively to the first inverting input of the summing circuit, and
couple the inverting output of the amplifier circuit, via a thirteenth signal path and a fourteenth signal path, directly to the second non-inverting input of the summing circuit and, via a fifteenth signal path and a sixteenth signal path, capacitively to the first non-inverting input of the summing circuit.

8. The chopper amplifier circuit as claimed in claim 1, wherein the demodulator circuit is configured to:
during a first switching phase:
couple the non-inverting output of the amplifier circuit, via a first signal path and a second signal path, directly to a first non-inverting input of the summing circuit,
couple the inverting output of the amplifier circuit, via a third signal path and a fourth signal path, directly to a first inverting input of a summing amplifier, and
during a second switching phase:
couple the non-inverting output of the amplifier circuit, via a fifth signal path and a sixth signal path, directly to a second inverting input of the summing circuit, and
couple the inverting output of the amplifier circuit, via a seventh signal path and an eighth signal path, directly to a second non-inverting input of the summing circuit,
wherein the first signal path and the eighth signal path are mutually coupled via a first capacitance,
wherein the eighth signal path is coupled to a ground via a second capacitance,
wherein the second signal path and the seventh signal path are mutually coupled via a third capacitance,
wherein the second signal path is coupled to the ground via a fourth capacitance,
wherein the third signal path and fifth signal path are mutually coupled via a fifth capacitance,
wherein the fifth signal path is coupled to the ground via a sixth capacitance,
wherein the fourth signal path and sixth signal path are mutually coupled via a seventh capacitance, and
wherein the fourth signal path is coupled to the ground via an eighth capacitance.

9. The chopper amplifier circuit as claimed in claim 1, wherein a first output of the modulator circuit is directly connected to the inverting input of the amplifier circuit, and a second output of the modulator circuit is directly connected to the non-inverting input of the amplifier circuit.

10. The chopper amplifier circuit as claimed in claim 1, wherein a non-inverting input of the modulator circuit is directly connected to a signal source, and an inverting input of the modulator circuit is directly connected to the signal source.

11. The chopper amplifier circuit as claimed in claim 1, further comprising:
a Hall effect sensor, configured for spinning current operation, for delivery of the voltage to the modulator circuit.

12. A method for operating a chopper amplifier circuit, the method comprising:
during different switching phases:
coupling an inverting output of an operational amplifier of the chopper amplifier circuit and a non-inverting output of the operational amplifier of the chopper amplifier circuit, both directly and capacitively, to each inverting input of a summing circuit and to each non-inverting input of the summing circuit, the summing circuit having a plurality of inverting inputs and a plurality of non-inverting inputs coupled to the operational amplifier according to the different switching phases.

13. The method as claimed in claim 12, further comprising:
during a first switching phase:
coupling the non-inverting output of the operational amplifier of the chopper amplifier circuit, both directly to a first non-inverting input of the summing circuit and capacitively to a second non-inverting input of the summing circuit; and
coupling the inverting output of the operational amplifier of the chopper amplifier circuit, both directly to a first inverting input of the summing circuit and capacitively to a second inverting input of the summing circuit, and
during a second switching phase:
coupling the non-inverting output of the operational amplifier of the chopper amplifier circuit, both directly to the second inverting input of the summing circuit and capacitively to the first inverting input of the summing circuit; and
coupling the non-inverting output of the amplifier circuit, both directly to the second inverting input of the summing circuit and capacitively to the first inverting input of the summing circuit.

14. The method as claimed in claim 12, further comprising:
during a first switching phase:
coupling the non-inverting output of the operational amplifier of the chopper amplifier circuit, via a first signal path, directly to a first non-inverting input of the summing circuit; and
coupling the inverting output of the operational amplifier of the chopper amplifier circuit, via a second signal path, directly to a first inverting input of the summing circuit, and
during a second switching phase:
coupling the non-inverting output of the operational amplifier of the chopper amplifier circuit, via a third signal path, directly to a second inverting input of the summing circuit; and
coupling the inverting output of the operational amplifier of the chopper amplifier circuit, via a fourth signal path, directly to a second non-inverting input of the summing circuit,
wherein the first signal path and the fourth signal path are mutually coupled via a first capacitance,
wherein the fourth signal path is coupled to a ground via a second capacitance,
wherein the second signal path and the third signal path are mutually coupled via a third capacitance,
wherein the third signal path is coupled to the ground via a fourth capacitance.

15. The method as claimed in claim 14, wherein the first capacitance is greater than the second capacitance, and
wherein the third capacitance is greater than the fourth capacitance.

16. The method as claimed in claim 14, wherein the first capacitance and the third capacitance are equally dimensioned, and the second capacitance and the fourth capacitance are equally dimensioned.

17. The method as claimed in claim 14, wherein the first capacitance is 10 to 20 times greater than the second capacitance, and
wherein the third capacitance is 10 to 20 times greater than the fourth capacitance.

* * * * *